United States Patent [19]

DeHeras et al.

[11] Patent Number: 4,773,534
[45] Date of Patent: Sep. 27, 1988

[54] PRINTED CIRCUIT BOARD TRANSPORTER

[76] Inventors: Charles DeHeras; Sheryll DeHeras, both of 1605 Oak Grove, San Marino, Calif. 91008

[21] Appl. No.: 174,217
[22] Filed: Mar. 28, 1988
[51] Int. Cl.⁴ .............................................. B65D 81/00
[52] U.S. Cl. ...................... 206/328; 206/334; 206/591; 206/594; 206/523; 206/522
[58] Field of Search ............... 206/328, 334, 591, 594, 206/523, 522

[56] References Cited

U.S. PATENT DOCUMENTS

| | | | |
|---|---|---|---|
| 4,154,344 | 5/1979 | Yenni, Jr. et al. | 206/328 |
| 4,160,503 | 7/1979 | Ohlbach | 206/328 |
| 4,211,324 | 7/1980 | Ohlbach | 206/328 |
| 4,241,829 | 12/1980 | Hardy | 206/328 |
| 4,267,927 | 5/1981 | English, Jr. | 206/328 |
| 4,293,070 | 10/1981 | Ohlbach | 206/328 |
| 4,308,953 | 1/1982 | Cohen | 206/328 |
| 4,480,747 | 11/1984 | Kazor et al. | 206/328 |

Primary Examiner—Joseph Man-Fu Moy
Attorney, Agent, or Firm—Jr. Averill

[57] ABSTRACT

A printed circuit board transporter which is durable and highly reusable and which provides a maximum of electrostatic discharge shielding. The box has a unitary outer shell fabricated from conductive polypropylene having a double wall separated by I-Beams. The outer shell is folded to provide a bottom, four sides, a top and a closing flap. The closing flap has at least one buckle which affixes to a clip affixed to the top. An inner layer of anti-static cushioning material is affixed to the inner surfaces of the bottom and top so that a printed circuit board can be held within the transporter and be safe from electrostatic discharge or radio frequency interference.

7 Claims, 1 Drawing Sheet

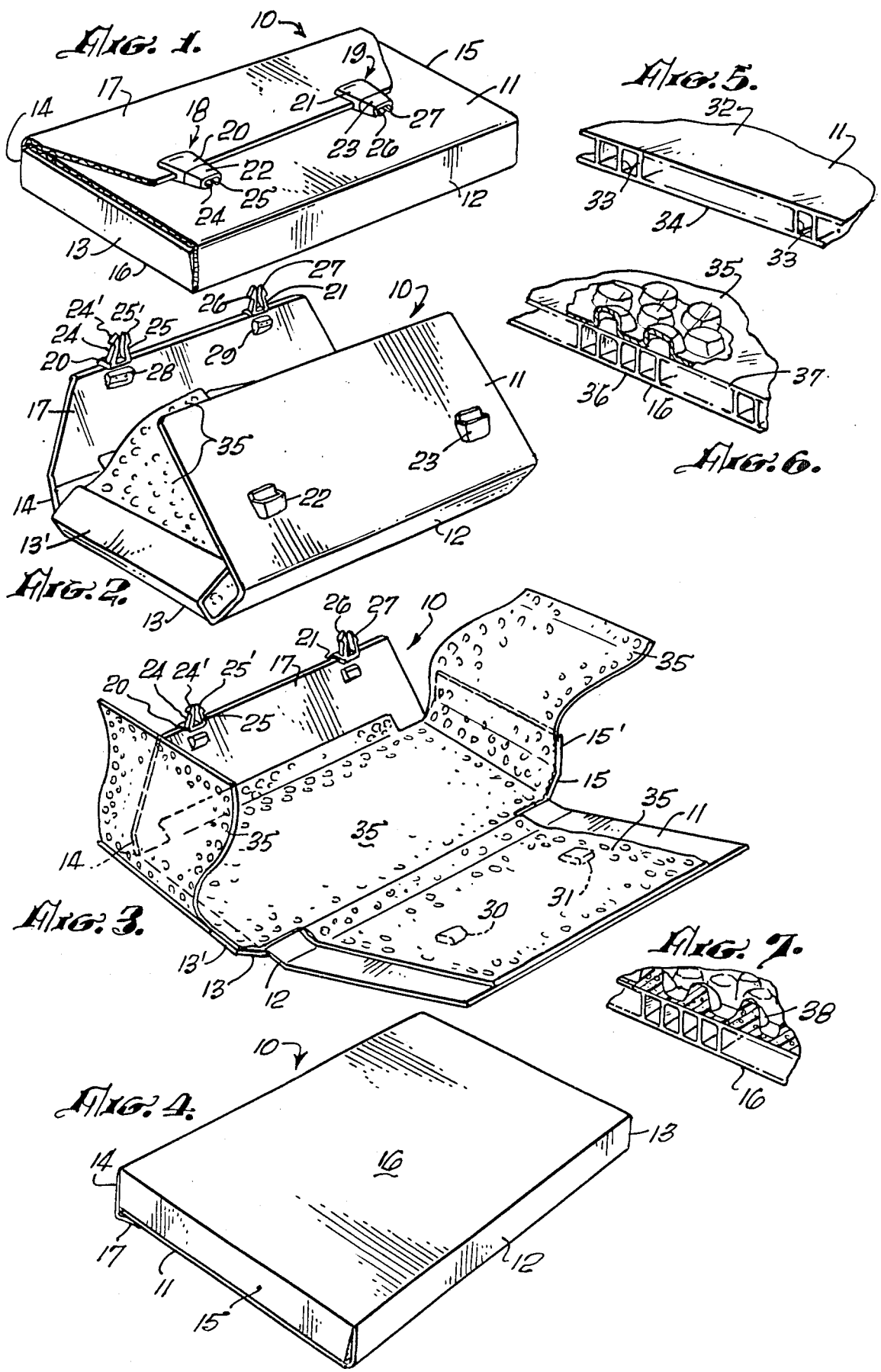

PRINTED CIRCUIT BOARD TRANSPORTER

BACKGROUND OF THE INVENTION

The field of the invention is static control containers and the invention relates more particularly to containers for transporting printed circuit boards and other devices which could be harmed by electrostatic discharge, electromagnetic interference or radio frequency interference as well as physical damage resulting from shock and vibration.

In the fabrication of modern electronic equipment, printed circuit boards are often fabricated in one location for use at a remote site. Although such boards can be fabricated with great concern for a static-free environment, the shipping step has, in the past, led to damage or destruction of the board as a result of electrostatic discharge. Such boards are also often physically fragile and the boards should be transported in such a way where they will not bend or be subject to impact. Plastic bags fabricated from anti-static material and including a conducting layer such as aluminum wire mesh screen have been used for transporting, but such bags do not provide protection against physical impact and, also, are typically relatively fragile and are usually not reused. Because of this one-time use, the cost of such packs is relatively high. Corrugated containers, including a conductive metal foil layer, have been used, but such containers are also typically not reusable, although they do provide improved protection from physical damage as compared to a pouch.

SUMMARY OF THE INVENTION

It is an object of the present invention to provide a printed circuit board transporter which is durable and highly reusable including a conductive outer shield, an anti-static inner cushioning layer and a self-locking closure.

The present invention is for a printed circuit board transporter comprising a unitary outer shell fabricated from conductive polypropylene having a double wall separated by a plurality of I-Beam members. The outer shell is folded to include a bottom, four sides, a top and a closing flap. The flap has at least one fixed lock buckle which mates with a clip affixed to the top. An inner layer of anti-static cushioning material is affixed to the inner surfaces of the transporter. Preferably, there are two fixed lock buckles which are fabricated from a polymer.

BRIEF DESCRIPTION OF THE DRAWINGS

FIG. 1 is a perspective view of the printed circuit board transporter of the present invention is a closed configuration.

FIG. 2 is a perspective view of the printed circuit board transporter of the present invention in a partially opened configuration.

FIG. 3 is a perspective view of the printed circuit board transporter of the present invention in a fully opened configuration.

FIG. 4 is a perspective view of the bottom of the printed circuit board of FIG. 1.

FIG. 5 is an enlarged perspective view of the conductive outer layer of the transporter of FIG. 1.

FIG. 6 is a perspective view of the anti-static cushioning layer of the transporter of FIG. 1.

FIG. 7 is a perspective view of an alternate configuration of anti-static cushioning layer of the transporter of FIG. 1.

DESCRIPTION OF THE PREFERRED EMBODIMENTS

The printed circuit board transporter of the present invention is shown in perspective view in FIG. 1 and indicated generally by reference character 10. Transporter 10 has a top 11, four sides 12, 13, 14 and 15, a bottom 16, shown best in FIG. 4, and a flap 17. Two buckles indicated generally by reference characters 18 and 19 have a first portion 20 and 21 affixed to the end of flap 17 and clip portions 22 and 23 affixed to top 11. Buckles 18 and 19 each have a pair of prongs 24 and 25 for buckle 18 and 26 and 27 for buckle 19. Prongs 24 and 25 fit within clip 22 and when the protrusions 24, and 25, at the end of prongs 24 and 25 exit at the end of clip 22, they snap outwardly and form a secure latch. All parts of buckle 18 and 19 are plastic and they provide a secure latch which may be reusable many times. The buckles are secured to the flap and to top 11 by plastic rivets which are held by plates 28, 29, 30 and 31.

The printed circuit board transporter 10 has a structural outer layer fabricated from conductive polypropylene. The material of the outer layer is shown in perspective view in FIG. 5 where it can be seen that the outer layer is a unitary material which has an outer surface 32 held to an inner surface 34 by a plurality of integral I-Beam members indicated by reference character 33. The material is extruded and has a thin wall, thus being both light and strong as well as durable. Such material provides substantial protection against physical damage while also being conductive to shield the contents of the transporter from radio frequency damage and static electricity.

The transporter of the present invention has a second protective layer shown best in FIG. 3 of the drawings, which layer is indicated generally by reference character 35. Layer 35 is an anti-static cushioning layer which is made from a polymer which includes an anti-static material such as a fatty amine which causes static electricity to slide off the outer surface thereof thereby protecting the printed circuit board within. The anti-static cushioning layer 35 may be either of the type shown in FIG. 6 or FIG. 7. The material shown in FIG. 6 has an outer layer 36 to which an inner layer 37 is adhered in a hexagonal pattern. The inner layer has a plurality of cells which provide substantial cushioning as well as anti-static protection. The anti-static material in FIG. 7 is indicated by reference character 38 and is a convoluted foam material which also contains an anti-static material which causes static electricity to quickly dissipate therefrom. Preferably, the anti-static layer is glued, or otherwise adhered, to the inner surface of bottom 16, sides 12, 13, 14 and 15, as well 15 as the flaps 13' and 15'. This greatly facilitates the insertion and removal of a circuit board within the transporter. The anti-static cushioning layer should be affixed to at least two of the inner surfaces of the transporter. For instance, it could be affixed to the inner surface of the bottom and one of the flaps such as flap 13', The important consideration is that the anti-static layer surrounds the printed circuit board in transit.

The use of the transporter of the present invention has a major advantage in that it is extensively reusable. Because it is opened by releasing buckles 18 and 19, there is no cutting or tearing involved in removing the packaged circuit board. In addition, the conductive polypropylene is very durable and is not degraded by moisture. The transporter is made from a single sheet of conductive polypropylene and, thus, there is no difficulty in reassembling the opened transporter. The clasps are particularly secure since the protrusions of the prongs snap in the clip portions 22 and 23 and cannot be removed without squeezing the prongs together. The transporter is of relatively low cost and can be made in different sizes to suit the part being transported.

The outer shell of the container of the present invention has a surface resistivity of $4 \times 10^3$ OHMS square. This meets MIL-P-82646(OS). The cushioning material is an anti-static cancel open cell foam per Fed.Spec. PPP-C-1842A Type III. The container with this foam cushioning will withstand a 30" drop test as per Federal Test Standard 101C, Method 5007.1.

The present embodiments of this invention are thus to be considered in all respects as illustrative and not restrictive; the scope of the invention being indicated by the appended claims rather than by the foregoing description. All changes which come within the meaning and range of equivalency of the claims are intended to be embraced therein.

What is claimed is:

1. A printed circuit board transporter which is durable and highly reusable and which provides a maximum of electrostatic discharge shielding, said transporter comprising:

a unitary outer shell fabricated from conductive polypropylene having a double wall separated by a plurality of I-Beam members, said outer shell being folded to include a bottom, four sides, a top and a closing flap, said flap having at least one fixed lock buckle which mates with a clip affixed to the top; and an inner layer of anti-static cushioning material affixed to at least two of the inner surfaces of the unitary outer shell.

2. The printed circuit board transporter of claim 1 wherein there are two fixed lock buckles affixed to the flap.

3. The printed circuit board transporter of claim 1 wherein said inner layer of anti-static cushioning material is fabricated with a convoluted anti-static foam.

4. The printed circuit board transporter of claim 1 wherein said inner layer of anti-static cushioning material is fabricated with open cell anti-static cancel polymeric material.

5. The printed circuit board transporter of claim 1 wherein said layer of anti-static cushioning material is adhered to the inner surface of said unitary outer shell.

6. The printed circuit board transporter of claim 1 wherein said at least one fixed lock buckle is fabricated from a polymer.

7. The printed circuit board transporter of claim 1 wherein said at least one fixed lock buckle has a pair of prongs including outwardly extending protrusions which are held by a clip member.

* * * * *